(12) United States Patent
Liu et al.

(10) Patent No.: US 11,282,754 B1
(45) Date of Patent: Mar. 22, 2022

(54) DIE SHIFT CORRECTION METHOD OF MASKLESS EXPOSURE MACHINE

(71) Applicants: Ta Yu Liu, Taichung (TW); Chihhua Chien, Taichung (TW); Chien Hua Lai, Taichung (TW); Shihhsun Chen, Taichung (TW)

(72) Inventors: Ta Yu Liu, Taichung (TW); Chihhua Chien, Taichung (TW); Chien Hua Lai, Taichung (TW); Shihhsun Chen, Taichung (TW)

( * ) Notice: Subject to any disclaimer, the term of this patent is extended or adjusted under 35 U.S.C. 154(b) by 70 days.

(21) Appl. No.: 17/023,366

(22) Filed: Sep. 17, 2020

(51) Int. Cl.
 *H01L 21/00* (2006.01)
 *H01L 21/66* (2006.01)
 *H01L 21/48* (2006.01)
(52) U.S. Cl.
 CPC .......... *H01L 22/20* (2013.01); *H01L 21/4853* (2013.01)
(58) Field of Classification Search
 None
 See application file for complete search history.

(56) References Cited

U.S. PATENT DOCUMENTS

2020/0019065 A1\* 1/2020 Chen ..................... G03F 9/7003

\* cited by examiner

*Primary Examiner* — Jack S Chen
(74) *Attorney, Agent, or Firm* — Bradley J. Thorson; DeWitt LLP (57) ABSTRACT

A die shift correction method for use by a maskless exposure machine is applied to a die bonded to a substrate. The substrate has plural contact holes. The die has plural contact points each intended to be subjected to a light exposure in order to form a conductive contact portion connected to the corresponding contact hole. The correction method includes: obtaining the state information of the die by a first pre-scanning means, wherein the state information includes shape and location information; comparing the state information of the die against a reference state, and calculating compensation values with which to correct the reference state and thereby bring the reference state into conformity to the state information of the die; and calculating a compensation section for the light exposure according to the compensation values in order for each conductive contact portion to have an exposure pattern formed at the corresponding contact hole.

4 Claims, 9 Drawing Sheets

Obtain state information of die by first pre-scanning means, wherein state information includes shape and location information.

Compare state information of die against reference state, and calculate compensation values with which to correct reference state and thereby bring reference state into conformity to state information of die.

Calculate compensation section exposure according to compensation values in order for each conductive contact portion to have exposure pattern formed at corresponding contact hole.

Obtain state information of die by first pre-scanning means, wherein state information includes shape and location information.

Compare state information of die against reference state, and calculate compensation values with which to correct reference state and thereby bring reference state into conformity to state information of die.

Calculate compensation section exposure according to compensation values in order for each conductive contact portion to have exposure pattern formed at corresponding contact hole.

| Obtain elevation information of die by second pre-scanning means. |

| Input elevation information of die into maskless exposure machine in order for maskless exposure machine to adjust focal length according to elevation information of die while performing light exposure operation and thereby keep focal point of light exposure operation at die |

DIE SHIFT CORRECTION METHOD OF MASKLESS EXPOSURE MACHINE

BACKGROUND OF THE INVENTION

1. Technical Field

The present invention relates to photolithography and more particularly to the die shift correction method of a maskless exposure machine.

2. Description of Related Art

Figure 7A:
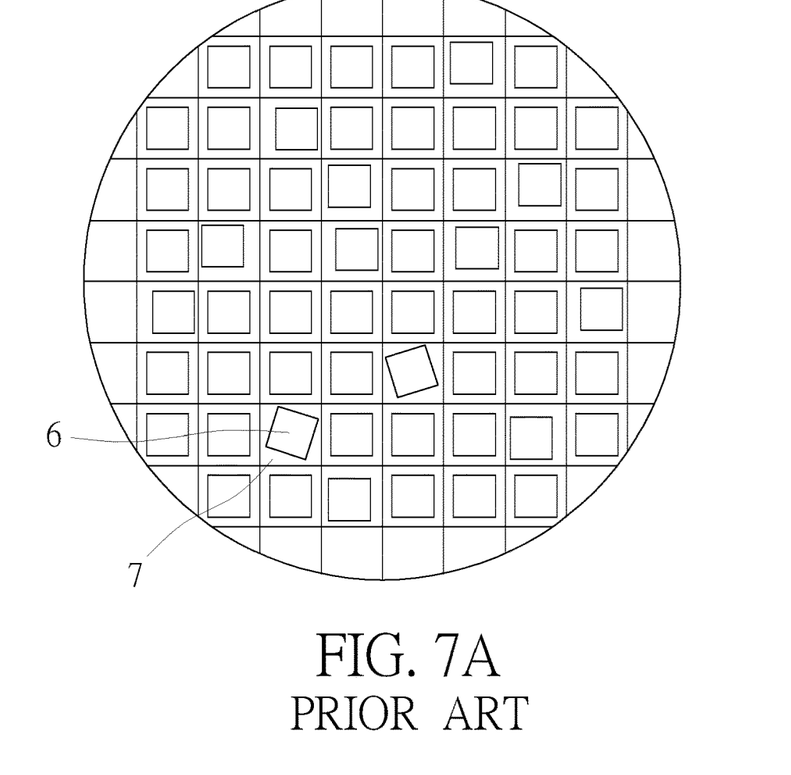
FIG. 7A and FIG. 7B show dies bonded to a wafer in the prior art.

A die undergoing integrated circuit (IC) fabrication has a plurality of contact points, and a wafer substrate carrying such dies has a corresponding number of contact holes. The dies are "bonded" to the substrate and then exposed to light in order for a conductive contact portion to be formed at each contact point and constitute part of a circuit. The other end of each conductive contact portion is supposed to be formed at the corresponding contact hole so that an external circuit can be properly connected to the conductive contact portion in a subsequent fabrication step. However, as shown in FIG. 7A, a die 6 bonded to the substrate 7 may have been shifted away from the standard position due to an operation error such that, referring to FIG. 8, each conductive contact portion 81 to be subsequently formed by an exposure to light may also deviate from its correct position and therefore fail to align precisely with the corresponding contact hole 71 in the substrate 7, making it difficult to ensure proper connection between the conductive contact portions 81 and an external circuit in a subsequent fabrication step.

Figure 8:
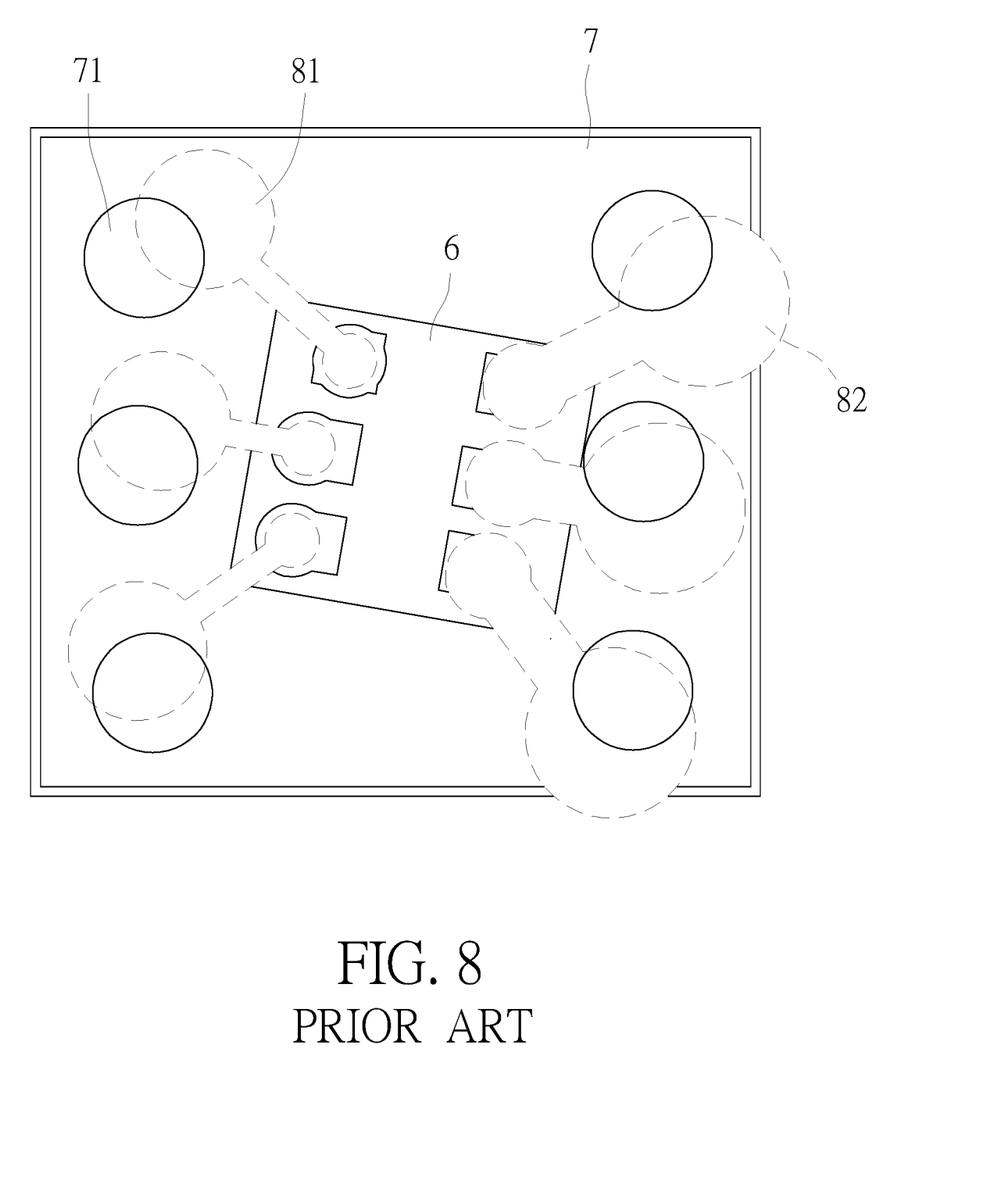
FIG. 8 shows exposure patterns formed in the prior art by performing a light exposure operation on an improperly positioned die.

One conventional method to solve the aforesaid problem is to enlarge the area of each substrate contact hole 71 so that even if the die 6 is shifted in place because of a die bonding error, each shifted conductive contact portion 81 will still fall within the extent of the corresponding contact hole 71. With the advancement of materials and technology, however, the die 6 and the substrate 7 are decreasing in volume and having more and more intricate structures that prevent the areas of the contact holes 71 from being sufficiently enlarged. Moreover, increasing the areas of the contact holes 71 will reduce the structural strength of the substrate 7, making the substrate 7 more susceptible to breakage. This conventional solution, therefore, leaves much to be desired.

Figure 7B:
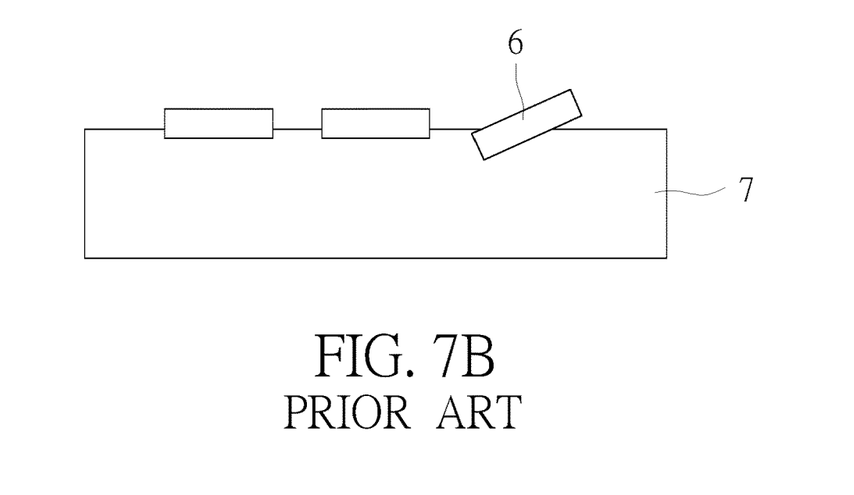
Figure 9:
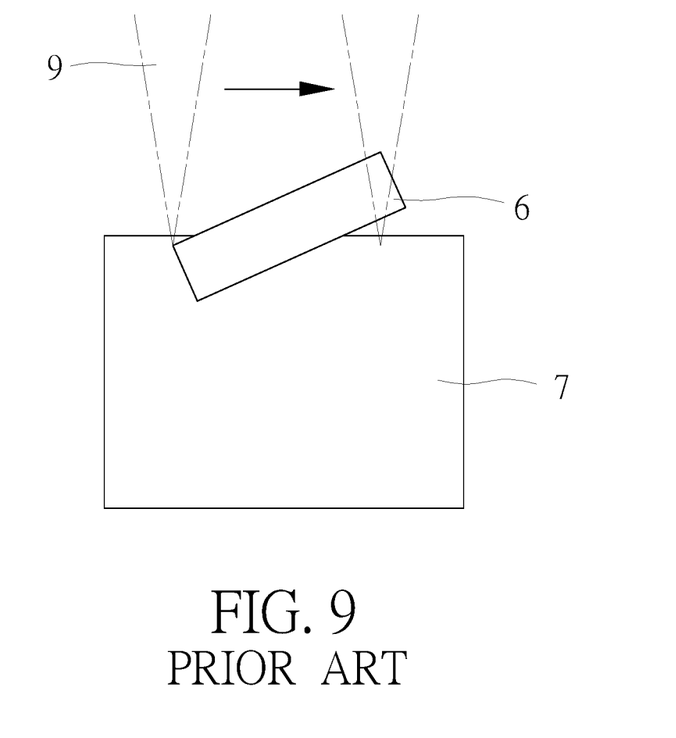
FIG. 9 shows how an exposure machine in the prior art operates on an improperly positioned die.

FIG. 7B shows another instance in which the die 6 is improperly bonded to the substrate 7. The die 6 in FIG. 7B is tilted or warps such that during the light exposure-based formation of conductive contact portions, referring to FIG. 9, the light 9 cannot be focused precisely on the die 6. As a result, referring to FIG. 8, the conductive contact portions 82 have larger line widths than designed, the severity of whose effect on product quality increases as the die is reduced in size.

To solve this problem, one prior art approach is to provide the exposure machine with a distance measuring device for measuring the distance between the light source and each die. The distance is measured while the exposure machine is performing a light exposure operation, and the focal length of the light exposure operation is adjusted in real time after the distance information is sent back to the exposure machine, the objective being to keep the focal point at each die being irradiated. However, referring to FIG. 9, the light 9 is moved at high speed during the light exposure operation, so by contrast, the time it takes for the distance measuring device to take a distance measurement and for the exposure machine to subsequently change the focal length is too long; in other words, the focal length is not changed as fast as the movement of the light 9. Consequently, the issue of having overly large exposed line widths remains to be fully addressed.

BRIEF SUMMARY OF THE INVENTION

The primary objective of the present invention is to provide a die shift correction method for use by a maskless exposure machine. The correction method involves calculating a compensation section according to the shape and location of a die bonded to a substrate and changing the location of an exposure pattern accordingly so that, by correcting a shift or error in position caused by die bonding, it is ensured that the exposure pattern will be formed at the corresponding contact hole.

To achieve the foregoing objective, the present invention provides a die shift correction method for use by a maskless exposure machine. The correction method is applied to a die that is bonded to a substrate. The substrate has a plurality of contact holes. The die has a plurality of contact points, and each contact point is intended to be subjected to a light exposure in order to form a conductive contact portion connected to the corresponding contact hole. The correction method includes the following steps:

obtaining the state information of the die by a first pre-scanning means, wherein the state information includes shape and location information;

comparing the state information of the die against a reference state, and calculating compensation values with which the reference state can be corrected to conform to the state information of the die; and calculating a compensation section for the light exposure according to the compensation values in order for each conductive contact portion to have an exposure pattern formed at the corresponding contact hole.

Preferably, the first pre-scanning means is capturing an image of the die on the substrate.

In one embodiment, the correction method further includes the steps of:

obtaining the elevation information of the die by a second pre-scanning means; and inputting the elevation information of the die into the maskless exposure machine in order for the maskless exposure machine to adjust a focal length according to the elevation information of the die while performing a light exposure operation and thereby keep the focal point of the light exposure operation at the die.

Preferably, the second pre-scanning means is measuring the distance between a laser rangefinder and the die with the laser rangefinder.

DETAILED DESCRIPTION OF THE INVENTION

The present invention provides a die shift correction method for use by a maskless exposure machine. The correction method is applied to a die structure bonded to a wafer substrate. The substrate has a plurality of contact holes. The die has a plurality of contact points, and each contact point is subjected to a light exposure operation by the maskless exposure machine, and hence to a light exposure, in order to form a conductive contact portion that makes up part of a circuit and is intended to extend to the corresponding contact hole of the substrate.

Figure 1:
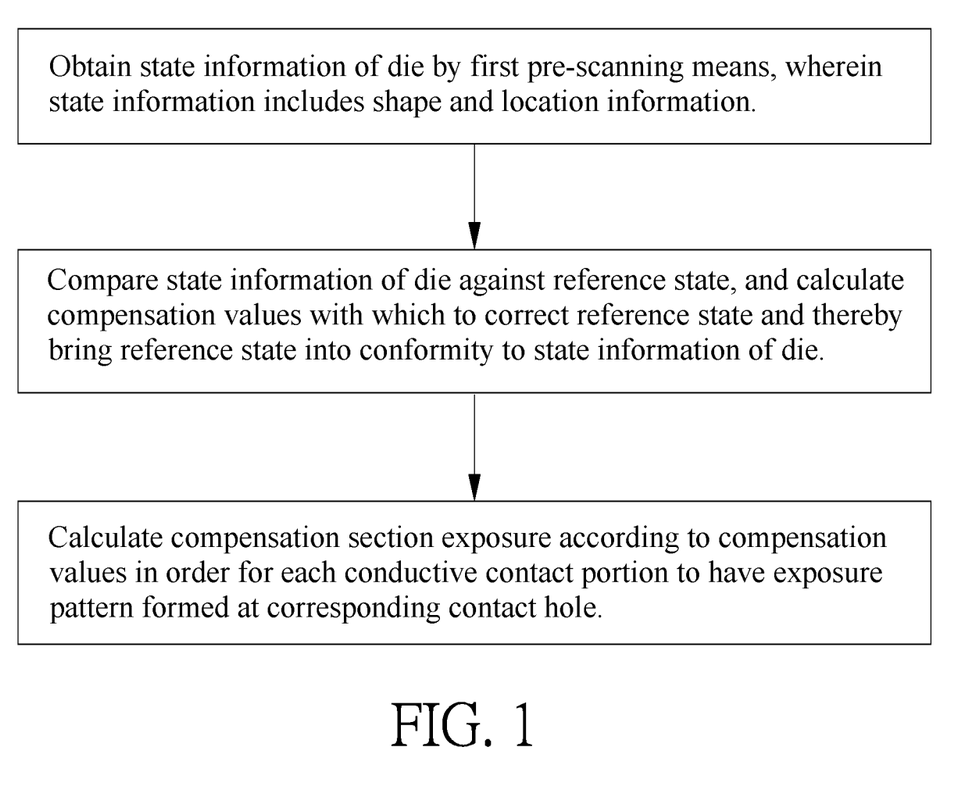
FIG. 1 is a flowchart of the die shift correction method of the present invention, wherein the flowchart aims to correct the positons of exposure patterns.

Referring to FIG. 1, the correction method of the present invention includes the steps of:

obtaining the state information of the die by a first pre-scanning means, wherein the state information includes shape and location information;

comparing the state information of the die against a reference state, and calculating compensation values with which the reference state can be corrected to conform to the state information of the die; and calculating a compensation section for the light exposure according to the compensation values in order for each conductive contact portion to have an exposure pattern formed at the corresponding contact hole.

Figure 2:
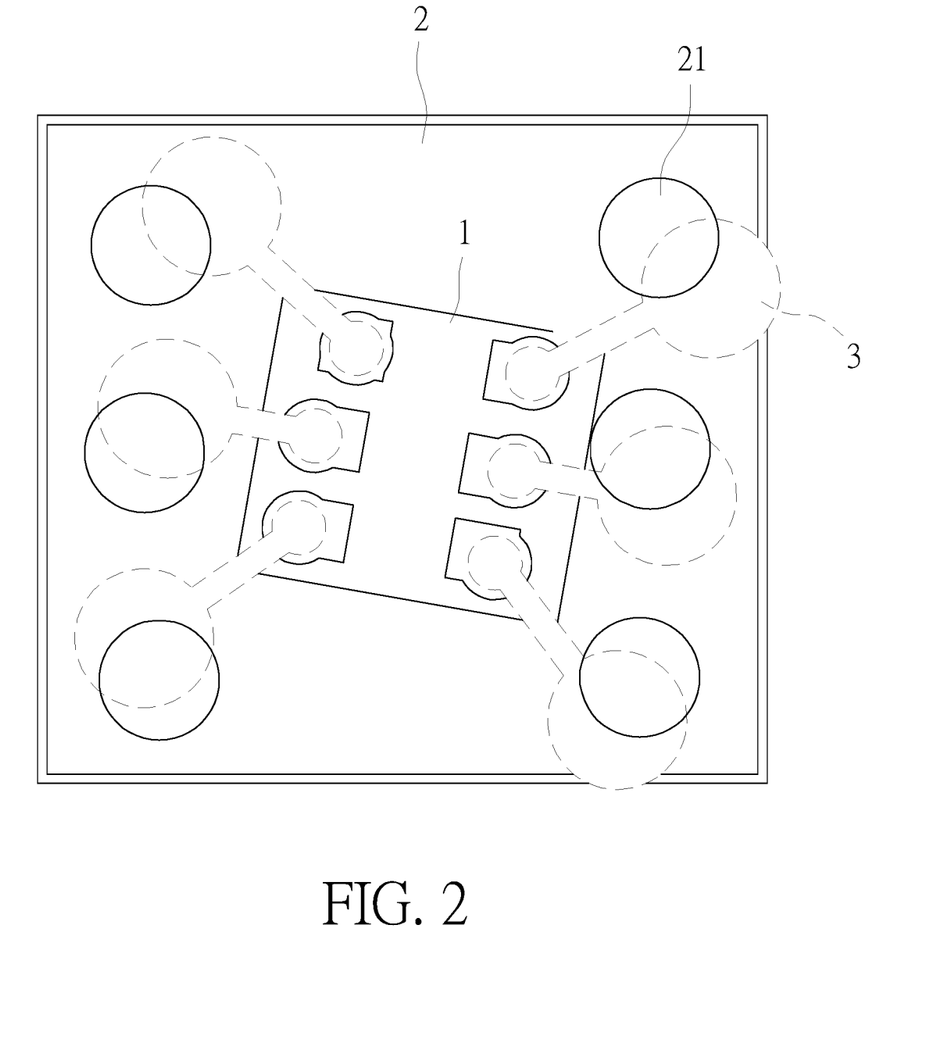
FIG. 2 is an image in the present invention that shows the state information of a die.
Figure 3:
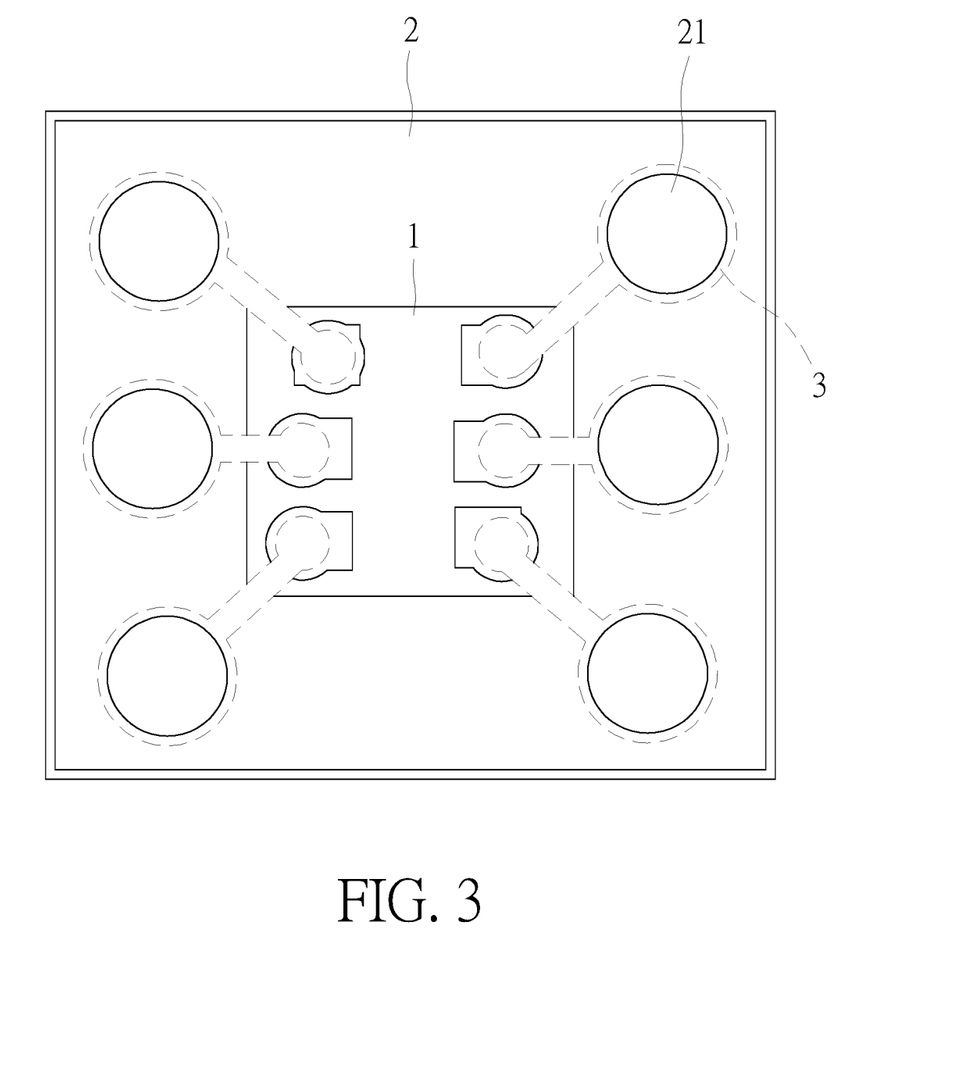
FIG. 3 shows a reference file in the present invention.
Figure 4:
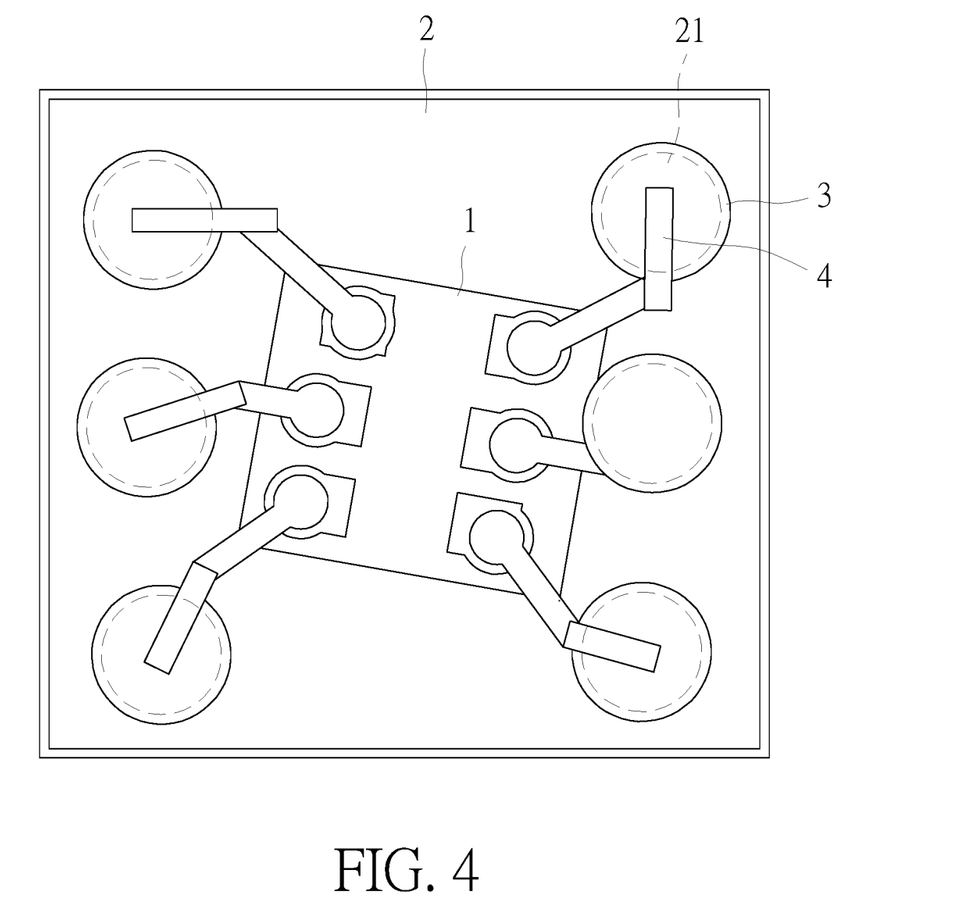
FIG. 4 shows a correction result of the correction method of the present invention.

Referring to FIG. 2, the die 1 may be shifted away from its predetermined position while being bonded to the wafer substrate 2 (i.e., during the die bonding process). Should that happen, the conductive contact portions 3 to be formed by the light exposure may deviate from their respective corrective positions too and fail to correspond precisely in position to the corresponding contact holes 21 of the substrate 2 respectively, which makes it difficult to ensure that the conductive contact portions 3 will be properly connected to an external circuit in a subsequent fabrication step. The correction method of the present invention, therefore, begins by obtaining the state information of the die 1 through a first pre-scanning means, wherein the state information includes shape and location information. In this embodiment, the first pre-scanning means is capturing an image of the die 1 on the substrate 2 with an image capture device, and an example of the captured image is shown in FIG. 2. By analyzing the image, the shape and location information of the die 1 on the substrate 2 can be obtained. Next, the state information of the die 1 is compared against a reference file as shown in FIG. 3, wherein the reference file includes such reference state information as the correct shape and location of the die 1 on the substrate 2. The actual locations of the die pads on the die 1 are also compared against the under-bump metallization (UBM) area in the reference file to obtain the difference therebetween. The graphic file of the conductive contact portions is then adjusted by linear or non-linear numerical calculation, and compensation values with which to correct the reference state and thereby bring the reference state into conformity to the actual shape and location of the die 1 are calculated. Following that, the compensation section 4 of each exposure area is calculated according to the compensation values, the goal being to connect the exposure pattern of each conductive contact portion 3 to the corresponding contact hole 21 via the corresponding compensation section 4 as shown in FIG. 4 so as to produce a continuous, gapless wiring layout, thereby correcting the shift or error in position caused by die bonding.

Figure 5:
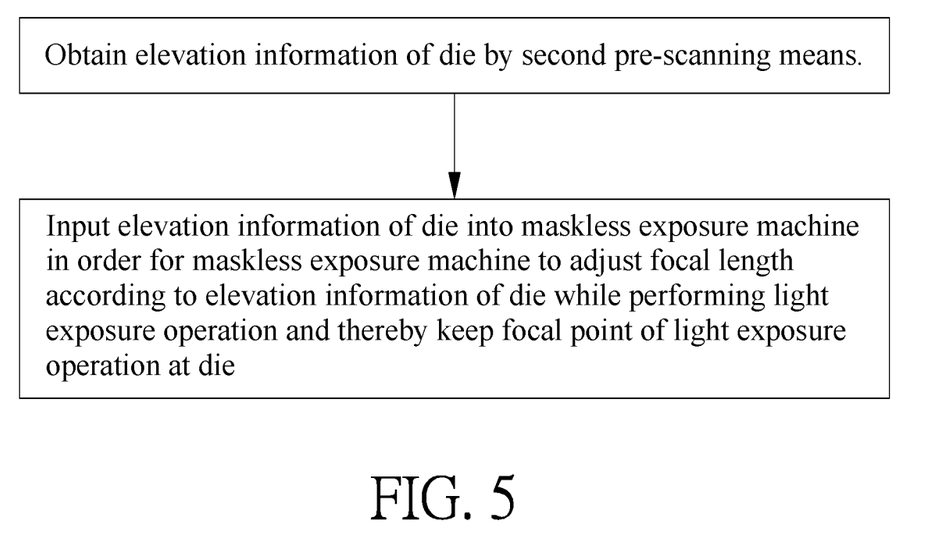
FIG. 5 is another flowchart of the die shift correction method of the present invention, wherein the flowchart aims to correct the line widths of exposure patterns.

Referring to FIG. 5, the present invention further provides a method for correcting exposed line widths, and continued from the above, this method includes the steps of:

obtaining the elevation information of the die by a second pre-scanning means; and inputting the elevation information of the die into the maskless exposure machine in order for the maskless exposure machine to adjust a focal length according to the elevation information of the die while performing a light exposure operation and thereby keep the focal point of the light exposure operation at the die.

Figure 6:
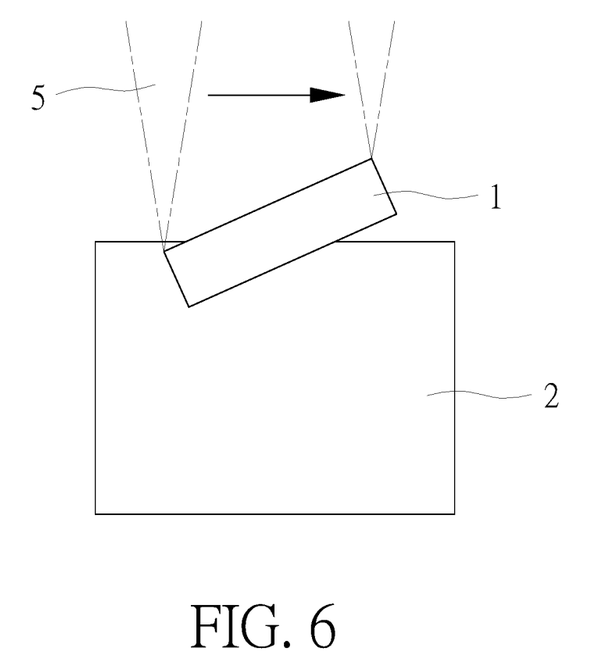
FIG. 6 shows the operation of an exposure machine after correction by the correction method of the present invention.

The second pre-scanning means may involve a laser rangefinder. For example, the elevation information of the die is plotted by measuring the distance between the laser rangefinder and the die with the laser rangefinder. The second pre-scanning means is put to use before the light exposure operation begins so that the elevation information of the die can be obtained in advance. Preferably, the second pre-scanning means is carried out together with the first pre-scanning means. The obtained elevation information of the die is input into the maskless exposure machine so that while performing the light exposure operation, the maskless exposure machine can change the focus length of the light exposure operation in real time according to the previously obtained elevation information of the die 1 as shown in FIG. 6 in order to keep the light 5 focused on the die 1, prevent the exposed line widths from expanding, and thereby increase product yield.

What is claimed is:

1. A die shift correction method of a maskless exposure machine, wherein the correction method is applied to a die bonded to a substrate, the substrate has a plurality of contact holes, the die has a plurality of contact points, and each said contact point is intended to be subjected to a light exposure in order to form a conductive contact portion connected to a corresponding one of the contact holes, the correction method comprising the steps of:

obtaining a state information of the die by a first pre-scanning means, wherein the state information comprises shape and location information;

comparing the state information of the die against a reference state, and calculating compensation values with which to correct the reference state and thereby bring the reference state into conformity to the state information of the die; and calculating a compensation section for the light exposure according to the compensation values in order for each said conductive contact portion to have an exposure pattern formed at the corresponding one of the contact holes.

2. The die shift correction method of the maskless exposure machine as claimed in claim 1, wherein the first pre-scanning means is capturing an image of the die on the substrate.

3. The die shift correction method of the maskless exposure machine as claimed in claim 1, further comprising the steps of:

obtaining an elevation information of the die by a second pre-scanning means; and inputting the elevation information of the die into the maskless exposure machine in order for the maskless exposure machine to adjust a focal length according to the elevation information of the die while performing a light exposure operation and thereby keep a focal point of the light exposure operation at the die.

4. The die shift correction method of the maskless exposure machine as claimed in claim 1, wherein the second pre-scanning means is measuring a distance between a laser rangefinder and the die with the laser rangefinder.

* * * * *